United States Patent [19]

Petr

[11] Patent Number: 4,710,652

[45] Date of Patent: Dec. 1, 1987

[54] INTERFERENCE SIGNAL COMPONENT COMPENSATION CIRCUIT

[75] Inventor: Jan Petr, Oberwil, Switzerland

[73] Assignee: Lgz Landis & Gyr Zug AG, Zug, Switzerland

[21] Appl. No.: 867,490

[22] Filed: May 27, 1986

[30] Foreign Application Priority Data

Feb. 10, 1986 [CH] Switzerland ........................... 519/86

[51] Int. Cl.<sup>4</sup> ........................ G01R 17/00; H03F 15/00
[52] U.S. Cl. .................................. 307/491; 307/513; 307/309; 307/310; 73/766; 328/165
[58] Field of Search .............. 307/491, 309, 310, 262, 307/520, 513; 328/165; 73/763, 765, 766

[56] References Cited

U.S. PATENT DOCUMENTS

| | | | |
|---|---|---|---|
| 3,555,310 | 1/1971 | Haeusler | 307/309 |
| 3,582,690 | 6/1971 | Yerman | 73/766 |
| 3,671,769 | 6/1972 | Tomomitsu et al. | 307/309 |
| 4,142,405 | 3/1979 | Stevens | 73/763 |
| 4,292,582 | 9/1981 | Hino | 307/309 |
| 4,404,856 | 9/1983 | Honda et al. | 73/766 |
| 4,463,274 | 7/1984 | Swartz | 307/309 |

*Primary Examiner*—John S. Heyman
*Attorney, Agent, or Firm*—Marmorek, Guttman & Rubenstein

[57] ABSTRACT

The present invention is an electrical circuit for use with a four-pole device. The four-pole device has two input connections and two output connections. The output of the four-pole device is measured at one output relative to a base potential present at the other output.

The electrical circuit comprises a two-poled switch, which is connected in such a manner, that in its first position a signal source is connected with the first input of the four-pole device and the output of an amplifier is connected with the second input of the four-pole device. In the switch's second position, the signal source is connected with the second input of the four-pole device and the output of the amplifier is connected with the first input of the four-pole device. The output of the four-pole device, which is at the base potential, is connected to an inverting input of the amplifier, while the non-inverting input of the amplifier is connected to a constant reference voltage ($U_R$). When connected in this fashion, the amplifier serves to compensate base potential present at one output of the four-pole device.

The switching arrangement serves to switch the polarity of an information containing component of the output signal of the four-pole device (which depends on the input signal source) without reversing the polarity of an interference component, which is produced within the four-pole device or which is produced in electronic components connected at the output side of the four-pole device. This may be useful for separating the information-containing and interference components in the output signal of the four-pole device.

6 Claims, 2 Drawing Figures

INTERFERENCE SIGNAL COMPONENT COMPENSATION CIRCUIT

FIELD OF INVENTION

This invention relates to an electrical circuit for a four-pole electronic device such as a bridge circuit, and more particularly, to a switching arrangement for regulating and compensating a base potential at one output of the four-pole device and for separating an informational component from an interference component in the output signal of the four-pole device.

BACKGROUND OF THE INVENTION

Electrical circuits of this kind are desirable for use with four-pole devices, where an input and output connection should not be connected to the ground directly, because otherwise a part of the four-pole device would be short-circuited. Such four-pole devices include for example bridge circuits comprising at least four electrical elements and which illustratively are used for temperature measurement, voltage measurement, torque rating, tension measurement, magnetic field measurement, or for measurement of another physical quantity.

The four-pole device may also be any other electronic element whose equivalent-circuit diagram is a bridge circuit. For example, a Hall-element is such an electronic element. A switching arrangement of the afore-mentioned kind is known from U.S. Pat. No. 4,142,405.

Typically, the output signal of the four-pole device includes a useful or information containing component which is dependent on an input signal and an interference component which is independent of the input signal. (Illustratively the input signal is produced by a source which is connected in single pole fashion to the four-pole device).

An object of the invention is to provide a switching arrangement of the aforementioned kind where the polarity of an information containing component of the output signal of the four-pole device, can be reversed without reversing the polarity of the interference component at the same time. This reversion of polarity can be used, for example, to separate the information containing component of the four-pole device output signal from the interference component, which is independent of the polarity of the input signal. Illustratively, the interference component, is produced internally in the four-pole device and is a thermoelectric voltage resulting from the contact of different metals or, in the case of an AC fed four-pole device, a direct current component, which is created by non-linearity of the four-pole device. An additional interference component may be produced in the process electronics located at the output of the four-pole device, for example an offset voltage.

SUMMARY OF THE INVENTION

The present invention is an electrical circuit for use with a four-pole device. The four-pole device has two input connections and two output connections. The output signal of the four-pole device is measured at one output relative to a base potential present at the other output.

The electrical circuit comprises a two-poled switch, which is connected in such a manner, that in its first position a signal source is connected with the first input of the four-pole device and the output of an amplifier is connected with the second input of the four-pole device. In the switch's second position, the signal source is connected with the second input of the four-pole device and the output of the amplifier is connected with the first input of the four-pole device. The output of the four-pole device, which is at the base potential, is connected to an inverting input of the amplifier, while the non-inverting input of the amplifier is connected to a constant reference voltage ($U_R$). When connected in this fashion, the amplifier serves to compensate base potential present at one output of the four-pole device.

The electrical circuit serves to switch the polarity of an information containing component of the output signal of the four-pole device (which depends on the input signal source) without reversing the polarity of an interference component, which is produced within the four-pole device or which is produced in electronic components connected at the output side of the four-pole device. This may be useful for separating the information-containing and interference components in the output signal of the four-pole device.

BRIEF DESCRIPTION OF THE DRAWINGS

The same reference numbers characterize the same parts in all figures.

DETAILED DESCRIPTION OF THE INVENTION

Figure 1:
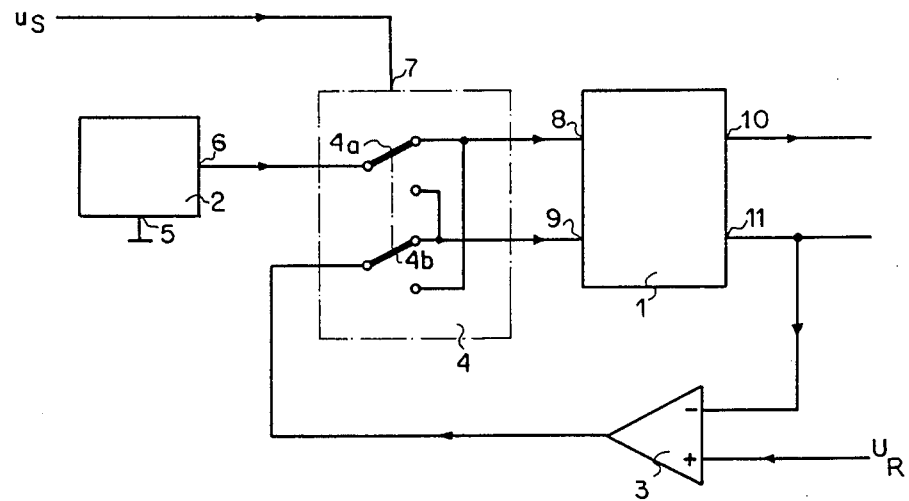
FIG. 1 shows an electrical circuit, in accordance with an illustrative embodiment of the present invention.

The electrical circuit of the present invention comprises a four-pole device 1, a source 2, an amplifier 3 and a controllable two-pole selector switch 4, which has a first switch contact 4a and a second switch contact 4b.

Source 2 is any signal source, that has two connections 5 and 6. Illustratively, source 2 is a current source or a voltage source. Connection 6 of the voltage source 2 is connected to an input of the four-pole device 1 by way of the switch contact 4a. The connection 5 of source 2 is connected to ground. The amplifier 3 is for example an operational amplifier. The selector switch 4 preferably comprises semiconductor switches, which for example are made using CMOS-technology. The selector switch 4 has a control input 7, and is controlled by a control voltage comprising rectangular pulses. Illustratively, the rectangular control pulses are used to periodically switch the selector switch 4.

The four-pole device 1 has two input connections 8 and 9 and two output connections 10 and 11. The first output connection 10 is a single-pole output of the electrical circuit. The voltage potential of the second output connection 11 forms a base potential for the output voltage of four-pole device 1. (This means that the voltage output at connection 10 is measured relative to the base voltage at connection 11). Output connection 11, which is carrying the base potential, is connected to an inverting input of amplifier 3. The non-inverting input of amplifier 3 is at a constant reference voltage $U_R$ and the output of amplifier 3 is connected with the input connections 8 and 9 of four-pole device 1 by way of the switch contact 4b of switch 4. The selector switch 4 is used to connect the four-pole device 1, source 2 and the amplifier 3 as follows. In the first position, (i.e. in the position shown in FIG. 1,) switch contact 4a connects connection 6 of source 2, with the first input connection 8 of the four-pole device 1 and switch contact 4b connects the output of amplifier 3 with input 9 of the four-pole device 1. In the second position of selector switch 4, connection 6 of source 2 is connected with the second input 9 of the four-pole device 1 by way of the first switch contact 4a, and the output of amplifier 3 is connected by way of the second selector switch contact 4b with the input connection 8 of the four-pole device 1.

Illustratively, the four-pole device 1 is an integrated Hall element in an integrated circuit. The inputs 8; 9 of the four-pole device 1 are then the supply inputs of the Hall element and the outputs 10, 11 of the four-pole device 1 are the outputs of the Hall element between which the Hall voltage is created.

Figure 2:
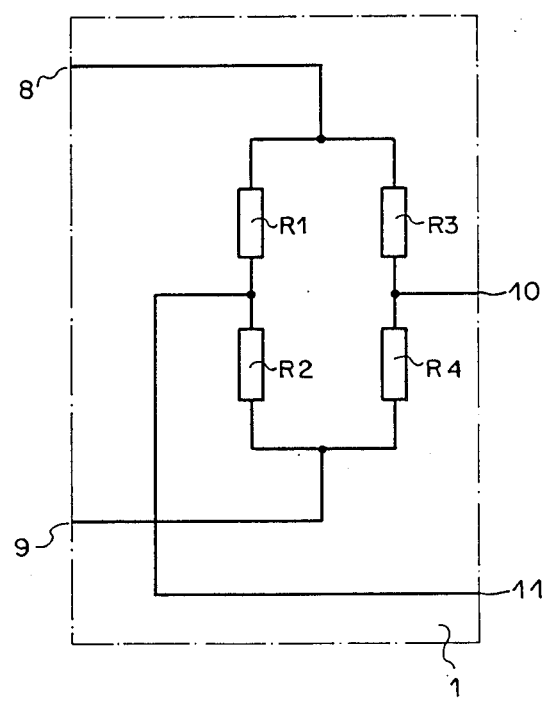
FIG. 2 shows a bridge circuit

The bridge circuit shown in FIG. 2 comprises four resistors R1, R2, R3 and R4 and shows for example the equivalent-circuit diagram of such a Hall element. Resistors R1 and R2 are serially connected, as are resistors R3 and R4.

Both series connections R1;R2 and R3;R4, however, are connected in parallel. The mutual connection of the resistors R1 and R3 represents the first input connection 8, the mutual connection of resistors R2 and R4 represents the second input connection 9, the mutual connection of resistors R3 and R4 represents the first output connection 10 and the mutual connection of resistors R1 and R2 represents the second output connection 11, of the four-pole device 1.

The amplifier 3 belongs to a regulating circuit, whose desired value is the reference voltage $U_R$ and whose actual value is the base voltage potential at the output connection 11. The latter is at the same time the base potential of the output voltage of the four-pole device 1 and is compensated with the help of amplifier 3, i.e. regulated down to zero voltage. In order to achieve this, the amplifier 3 compares the desired and the actual values and produces at its output a voltage, which is proportional to the difference between the desired and actual values and which over the switch contact 4b and the four-pole device 1 counteracts the voltage potential at the output connection 11 of the four-pole 1 in such a manner, that the difference of the desired and actual values equal zero. If this is the case, than the voltage potential of the output connection 11 equals the reference voltage $U_R$, i.e. zero voltage, if $U_R=0$. However because of the existing "offset" voltage the reference voltage $U_R$ should be chosen not exactly, but only tentatively at zero voltage.

Since the information containing signal that is produced by source 2 is reversed in polarity by switch 4 before reaching the four-pole device 2, this reversion of polarity has no influence on the polarity of the interference component of the output voltage of the four-pole device 1, which illustratively is produced internally in the four-pole 1. Thus the polarity of this interference component is independent, for example, of periodical switches of polarity of the information containing signal.

Finally, the above described embodiments of the invention are intended to be illustrative only. Numerous alternative embodiments may be devised by those skilled in the art, without departing from the spirit and scope of the following claims.

I claim:

1. An interference signal component compensation circuit for use with a four-pole device wherein two poles thereof form inputs and two poles thereof form outputs in which the output signal of said four-pole device is measured from one output relative to a base potential at the other output, comprising:

an amplifier having an inverting input coupled to the base potential on the other output of said four-pole device and having a non-inverting input operable for being coupled to a reference voltage, said amplifier having an output voltage which is proportional to the difference between said base potential and said reference voltage; and a reversing two-pole switch connected to the inputs of said four-pole device and having one connection to the output of said amplifier and another connection operable for being coupled to a signal source; said reversing switch operable for reversing the connection of said signal source and said amplifier to the inputs of said four-pole device.

2. The circuit of claim 1, wherein said four-pole device is a Hall element.

3. The circuit of claim 1, wherein said two-pole switch is operable to respond to a control voltage for its switching.

4. The circuit of claim 1, wherein said signal source is a current source.

5. The circuit of claim 1, wherein said signal source is a voltage source.

6. The circuit of claim 1, wherein said reference voltage has a value which substantially counteracts said base potential.

* * * * *